US010234520B2

(12) United States Patent
Littin et al.

(10) Patent No.: US 10,234,520 B2
(45) Date of Patent: Mar. 19, 2019

(54) ARRANGEMENT FOR MODIFYING A MAIN MAGNETIC FIELD AND METHOD FOR PRODUCING SUCH AN ARRANGEMENT

(71) Applicant: Albert-Ludwigs-Univeristat Freiburg, Freiburg (DE)

(72) Inventors: Sebastian Littin, Freiburg (DE); Feng Jia, Freiburg (DE); Maxim Zaitsev, Freiburg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 380 days.

(21) Appl. No.: 15/152,773

(22) Filed: May 12, 2016

(65) Prior Publication Data

US 2016/0334480 A1 Nov. 17, 2016

(30) Foreign Application Priority Data

May 12, 2015 (DE) .......................... 10 2015 005 944

(51) Int. Cl.
  *G01R 33/385* (2006.01)
  *G01R 33/3875* (2006.01)
  *G01R 33/421* (2006.01)

(52) U.S. Cl.
  CPC ..... *G01R 33/3858* (2013.01); *G01R 33/3875* (2013.01); *G01R 33/4215* (2013.01)

(58) Field of Classification Search
  USPC ........................................ 324/316, 320, 322
  See application file for complete search history.

(56) References Cited

U.S. PATENT DOCUMENTS

| 4,733,190 | A | * | 3/1988 | Dembinski | ...... G01R 33/34007 |
| | | | | | 324/222 |
| 5,661,399 | A | * | 8/1997 | Sellers | ............... G01R 33/3854 |
| | | | | | 324/318 |
| 6,311,389 | B1 | | 11/2001 | Uosaki et al. | |
| 6,867,592 | B2 | | 3/2005 | Gebhardt et al. | |
| 2012/0068707 | A1 | | 3/2012 | Begg | |
| 2012/0268133 | A1 | | 10/2012 | Peter et al. | |

FOREIGN PATENT DOCUMENTS

| DE | 19722211 | 8/1998 |
| DE | 19856802 | 8/2000 |
| DE | 10219769 | 1/2004 |
| WO | 2007062227 | 5/2007 |
| WO | 2011054923 | 5/2011 |

OTHER PUBLICATIONS

Juchem, Christopher et al., "Dynamic multi-coil shimming of the human brain at 7 T", Journal of Magnetic Resonance, vol. 212, No. 2, Jul. 23, 2011, pp. 280-288.

(Continued)

*Primary Examiner* — Vincent Q Nguyen
(74) *Attorney, Agent, or Firm* — Volpe and Koenig, P.C.

(57) ABSTRACT

A carrier structure (2) of an arrangement (1) for modifying a main magnetic field generated in a magnetic resonance tomograph from multiple carrier elements (3, 37). A conductor arrangement (4) is respectively arranged on each carrier element (3, 37). The conductor arrangements (4) respectively include a primary conductor arrangement (6) for generating a primary magnetic field that modifies the main magnetic field and a secondary conductor arrangement (7) for shielding the primary magnetic field. A method for producing a modularly constructible arrangement (1) is provided, which can be used for example for spatial encoding.

20 Claims, 7 Drawing Sheets

(56) References Cited

OTHER PUBLICATIONS

Hidalgo-Tobon, S.S., "Theory of gradient coil design methods for magnetic resonance imaging", Concepts in Magnetic Resonance Part A, vol. 36A, No. 4, Jul. 21, 2010, pp. 223-242.
Turner, et al., "Gradient coil design: A review of methods", Magnetic Resonance Imaging, Elsevier Scient, Tarrytown, NY, US, vol. 11, No. 7, Jan. 1, 1993, pp. 903-920.
Littin, Sebastian et al:, "Shielded Matrix Gradient Coil", Proceedings of the International Society for Magnetic Resonance in Medicine, ISMRM, 23rd Annual Meeting and Exhibition, Toronto, Ontario, Canada, May 30-Jun. 5, 2015, No. 1022.
Littin, Sebastian et al:, "Sinusoidal PatLoc imaging using matrix gradient coils", Proceedings of the International Society for Magnetic Resonance in Medicine, ISMRM, 21st Annual Meeting and Exhibition, Salt Lake City, Utah, USA, Apr. 20-26, 2013, p. 2709.
Feng, Jia, et al.: "Performance evaluation of matrix gradient coils", Magnetic Resonance Materials in Physics, Biology and Medicine, Springer, Germany, GB, vol. 29, No. 1, Dec. 14, 2015, pp. 59-73.
Juchem et al., "Magnetic Field Homogenization of the Human Prefrontal Cortex with a Set of Localized Electrical oils", Magnetic Resonance in Medicine 63:171-180 (2010).
Juchem et al., "Magnetic Field Modeling with a Set of Individual Coils", Journal of Magnetic Resonance, 204, pp. 281-289 (2010).
Juchem et al., "Multi-coil Magnetic Field Modeling", Journal of Magnetic Resonance, 236, pp. 95-104 (2013).
Juchem et al., "Dynamic Multi-coil Technique (DYNAMITE) Shimming for Echo-Planar Imagining of the Human Brain at 7 Tesla", Neuroimage, 105, pp. 462-472 (2015).

\* cited by examiner

ARRANGEMENT FOR MODIFYING A MAIN MAGNETIC FIELD AND METHOD FOR PRODUCING SUCH AN ARRANGEMENT

INCORPORATION BY REFERENCE

The following documents are incorporated herein by reference as if fully set forth: German Patent Application No. 102015005944.0, filed May 12, 2015.

BACKGROUND

The invention relates to an arrangement for modifying a main magnetic field generated in a magnetic resonance tomograph. The arrangement has a carrier structure.

Commercially available magnetic resonance tomographs (MR tomographs), and consequently also MR spectrometers, with an imaging function are often equipped with such an arrangement. It usually comprises three gradient coils and/or a specific number of shim coils wound onto a common cylindrical carrier structure.

The invention also relates to a method for producing an arrangement of the type described at the beginning. Such production methods are known.

MR tomography represents an imaging method that is afforded great importance for example in medical diagnostics for representing the structure and function of tissue and organs.

In order to align nuclear spins of an object being examined, an MR tomograph generally has a main magnet, with which a main magnetic field that is as static as possible and virtually homogeneous, often also referred to as a B0 field, can be generated in a z direction. Often used for this purpose is a superconducting main magnet, with which a field strength of for example between 0.5 T and 3 T can be generated.

A gradient system serves especially for spatial encoding, by which locational information can be obtained by way of the measuring signals recorded by an RF receiving coil. For this purpose, electrical currents are specifically generated by special current sources, known as gradient amplifiers, and are passed through primary coils of an arrangement described at the beginning. The strength and direction of the currents can in this case be set by means of a control unit. In the prior art, x, y and z coils generally form the primary coils. With such a system of x, y and z coils it is possible to generate a primary magnetic field, which modifies the main magnetic field and the z component of which varies linearly in the examination region. A field gradient of any desired orientation may in this case be generated by suitably setting the coil currents. This is a consequence of the superposition principle and the fact that with the x coil (y, z coil) a primary magnetic field with a field gradient in the x direction (y, z direction) can be generated.

A gradient system may also have a shielding unit ("shield") with three secondary x, y and z coils, with which a secondary magnetic field can be generated, which outwardly shields the primary magnetic field generated by the primary x, y and z coils, in particular to reduce or prevent disadvantageous interactions with other components of the MR tomograph, in particular with the cryostat and components of the main magnet. It is required in this case to couple the shielding coils electrically with the primary coils. This usually takes place subsequently by means of soldering, whereby the primary coils are electrically connected to the corresponding secondary coils. However, such a type of production is laborious.

An MR tomograph is often equipped with a shimming system. The shimming system has the purpose of compensating for inhomogeneities of the main magnetic field, known as "shimming". With the x, y and z coils of a gradient system, only linear inhomogeneities can be corrected. In the case of "active shimming", the prior art provides for the correction of inhomogeneities of a higher order by using shim coils, which are designed to generate magnetic fields of a higher order, each shim coil generating a magnetic field of a specific order.

Since the requirements of shimming systems and gradient systems are different, the type of construction of gradient and shim coils may also differ. For example, there are different requirements for the switching speed and field strength that can be generated, so that the coils may have significantly different inductance and resistance values.

In the case of the customary MR tomographs with a cylindrical examination region, the coils of gradient and shimming systems are also respectively formed in a cylindrical manner and extend over the entire length of the examination region. The coils in this case form cylindrical layers with different radii and are mounted on a common carrier or form a common carrier structure, which is usually stabilized by casting, for example in epoxy resin.

In response to the only limited flexibility of such gradient and shimming systems with regard to the magnetic fields that can be generated, for some years efforts have taken a new direction. Systems known as matrix gradient systems have a multiplicity of relatively small individual coils, which in the case of closed systems are often arranged on a cylindrical surface and in the case of open systems are often arranged distributed on two planar surfaces. In this case, the multiplicity of individual coils in the case of the closed systems are arranged on a cylindrical carrier element and in the case of the open systems are arranged on at most two planar carrier elements that are spaced apart from one another and not neighboring one another.

Due to the fact that a high degree of flexibility can be achieved with matrix gradient systems with regard to the form of the magnetic fields that can be generated, such systems can also be designed as matrix shimming systems with suitable resistance and inductance values, or else such systems can be designed as combined gradient-shimming systems.

Due to the fact that the matrix technology is a new technological development and due to the complexity of matrix gradient systems, the few systems that are currently known still leave great room for improvement and are in great need of improvement.

DE 102 19 769 B3 discloses a magnetic resonance apparatus and a carrier device that can be equipped with shim elements, wherein a gradient coil system substantially has the form of a hollow cylinder, at least one receiving space extends in the direction of a principal axis of the hollow cylinder and has at least a longitudinal extent which is approximately that of the gradient coil system, wherein there is formed at least one carrier device, which can be introduced into the receiving space and can be equipped with shim elements, and at least one hollow body for conducting a cooling medium that cools the shim elements, which can be arranged in the receiving space, and which extends with at least a longitudinal extent which is approximately that of the gradient coil system along the direction of the principal axis.

DE 198 56 802 A1 discloses a gradient coil for magnetic resonance scanners with a primary coil produced on a central carrier and a secondary coil that surrounds the primary coil and serves for active magnet shielding, which are both embedded in a casting compound, wherein a segment cage, preferably forming the carrier of the secondary coil, arranged between the primary coil and the secondary coil and embedded in the casting compound, is formed from preferably axially continuous plastic profiles.

DE 197 22 211 A1 discloses a method for producing an actively shielded gradient coil arrangement for a magnetic resonance apparatus with a primary gradient coil set for generating gradient fields within an examination space and a secondary gradient coil set for shielding from stray fields, wherein the following steps are carried out: constructing all of the gradient coils belonging to the primary gradient coil set and secondary gradient coil set individually or in subassemblies with one or two gradient coils on a first part of a casting mold, completing the casting mold for casting, casting the gradient coils with a casting material and removing the gradient coil arrangement from the casting mold after curing of the casting material.

SUMMARY

The invention is based on the object of improving the functional properties of an arrangement of the type described at the beginning.

To achieve this object, one or more features of the invention can be used. In particular, according to the invention it is consequently provided that in the case of an arrangement of the type described at the beginning for achieving the stated object that the carrier structure has at least three carrier elements, that a conductor arrangement is respectively arranged on the carrier elements and that these conductor arrangements respectively comprise a primary conductor arrangement for generating a primary magnetic field that modifies the main magnetic field and a secondary conductor arrangement for shielding the primary magnetic field.

According to the aforementioned arrangement, it is provided that the carrier structure has at least three carrier elements and that a conductor arrangement is respectively arranged on the carrier elements. The arrangement consequently has at least three structural elements, which respectively comprise a carrier element and a conductor arrangement. The conductor arrangements may for example be coils.

The carrier structure preferably has multiple or at least four or at least eight or a multiplicity of carrier elements, preferably a number between 6 and 14 carrier elements, along a first direction and along a second direction, for example 7 times 12 carrier elements. The carrier structure may in particular be assembled and/or be able to be assembled and/or be formed and/or be able to be formed by the carrier elements. Such a modular carrier structure may have the decisive advantage that, as a result, gradient and/or shimming systems with improved properties in comparison with systems according to the prior art can be constructed, it being possible on account of the modularity for the production of the arrangement to take place inexpensively and application-specifically.

Thus, as a result, for example primary magnetic fields of a wide variety of geometries can be produced. It may also be possible to achieve advantageous properties, such as for example shielding, freedom from forces and freedom from torque, of the overall arrangement, in particular also by each individual structural element or the conductor arrangements arranged on the respective carrier element, or subconductor arrangements of the same, having these advantageous properties.

According to the aforementioned arrangement of the invention, it is also provided that the conductor arrangements respectively comprise a primary conductor arrangement for generating a primary magnetic field that modifies the main magnetic field and a secondary conductor arrangement for shielding the primary magnetic field. As a result, disturbing factors that would otherwise adversely influence the functional capability of the arrangement can be reduced in their effect or be eliminated. It is in particular achievable that the structural elements are self-shielding. It may be expedient if the primary conductor arrangements respectively have conductor portions which are interconnected with one another in series, with which primary magnetic field contributions along the z direction of the main magnetic field can be generated.

Consequently, the functional properties of an arrangement of the type described at the beginning are improved by an arrangement that has the features according to the aforementioned aspects of the invention.

In the case of an advantageous refinement of the arrangement, it may be provided that the primary conductor arrangements can be supplied with current independently of one another or can be supplied with current independently of one another in pairs. Being able to be supplied with current independently in pairs may for example be characterized in that two arbitrarily selected primary conductor arrangements can be supplied with current independently of one another. It may be provided in particular that the primary conductor arrangements define a set of primary conductor arrangements and that it is true for each subset of this set with two arbitrary primary conductor arrangements that these two arbitrary primary conductor arrangements can be supplied with current independently of one another. As an alternative or in addition, it may be provided that the conductor arrangements can respectively be connected separately from one another to a current source and/or to a current supply. Such refinements allow the construction of matrix arrangements with which primary magnetic fields of a wide variety of geometries can be generated in a flexible way.

A gradient amplifier for example may be taken into consideration as a current source. It may be advantageous for reasons of cost if, during the actual operation of the arrangement, not every conductor arrangement is connected to current sources that operate fully independently of one another. Thus, it may be advantageous if the current sources are formed by one output respectively of an interconnecting device. For operating the arrangement, a limited number of gradient amplifiers operating independently of one another may for example be connected to inputs of the interconnecting device and the conductor arrangements may be connected to outputs of the interconnecting device.

The interconnecting device may in this case be designed in such a way that each input is interconnected with at least one output, but that also more than one output can be interconnected with the same input. It is particularly advantageous if the interconnecting device is controllable, so that the interconnection of inputs and outputs is temporary and/or variable. If the arrangement is connected to such an interconnecting device, the conductor arrangements can be supplied with current independently of one another in pairs.

In order to be able to construct the carrier structure in a particularly stable manner, in the case of an advantageous refinement of the arrangement it is provided that the carrier elements are mechanically connected to neighboring carrier elements. At least one or each carrier element may in this case be respectively mechanically connected to at least one, more than one or all of the neighboring carrier elements. It may also be provided that the carrier elements contact neighboring carrier elements. It may in this case be provided that the carrier structure can be produced from separate carrier elements. The carrier elements may be releasably connected, so that the carrier structure can be dismantled into the carrier elements. The carrier elements may be connected in an interlocking manner, for example by receptacle counterparts that are inserted or pushed into receptacles and/or by using snap-in elements. A frictionally engaging connection alternatively or additionally comes into consideration, for example using fitted pins that can be pushed into drilled holes in a neighboring carrier element. In order to increase the stability of the carrier structure further, the carrier elements may however also be connected to neighboring carrier elements in a material-bowling manner, for example by an adhesive applied to contact areas.

For stabilizing the carrier structure, it may alternatively or additionally be provided that each carrier element has at least one receptacle for receiving a receptacle counterpart of a neighboring carrier element. The receptacle counterpart may in particular be connected to the carrier element in one piece and/or be produced from the same material as the carrier element and/or be able to be inserted or pushed into the receptacle.

In the case of a further advantageous refinement of the arrangement, it may be provided that the conductor arrangements respectively comprise at least one conductor. The at least one conductor may be for example at least one wire and/or at least one stranded wire and/or respectively a multiplicity of wires.

In the case of a further advantageous refinement of the arrangement, it may be provided that the conductor arrangements respectively include precisely one conductor. The conductor may be for example a wire or a stranded wire. In the case of such a refinement, this conductor consequently forms both the secondary conductor arrangement and the primary conductor arrangement. As an alternative or in addition, it may be provided that the conductor arrangements are respectively formed by at least one coil. The conductor arrangements may also be formed by a winding. Preferably, precisely one coil and/or winding is used for this purpose. In the case of a further refinement, it may alternatively or additionally be provided that the conductor arrangements are respectively formed without branching. Such refinements may be advantageous, since they can be produced particularly inexpensively and at the same time can be operated simply. In particular, the individual structural elements of the arrangement can be produced in a particularly efficient way, for example in that a wire is wound around the respective carrier element.

In the case of a further advantageous refinement of the arrangement, it may be provided that the conductor arrangements in pairs have a linking number of zero. The linking number may for example be characterized in that it measures in pairs the number of turns of the conductor arrangements around one another. As an alternative or in addition, it may be provided that the conductor arrangements are separable from one another without nodes, in particular in such a way that the arrangement can be dismantled by pulling the carrier elements apart. As an alternative or in addition, it may also be provided that the conductor arrangements are arranged or can be arranged without solder points. It may be expedient if these properties apply not only to the conductor arrangements as such but additionally also to the conductor arrangements together with terminal conductors connected to them, possibly in one piece. Such refinements may have the advantage that the arrangement can be constructed without having to solder wires to one another and/or that the arrangement can be assembled directly from finished structural elements that are already able to be supplied with current, or else can be dismantled into their structural elements, so that the production process and/or repair processes are simplified.

Production may be particularly quick and inexpensive if it is provided that the conductor arrangements are respectively arranged on an outer surface of the respective carrier element. In such a case, the arrangement may also be such that it can be assembled from its structural elements and dismantled again into its structural elements. The respective carrier element is that carrier element on which the respective conductor arrangement is arranged. It may alternatively or additionally be provided that at least one conductor or conductor portion of the conductor arrangement is arranged on the outer surface of the respective carrier element.

In the case of a further advantageous refinement of the arrangement, it may be provided that the carrier structure forms at least two surfaces that are spaced apart from one another. The surfaces may in this case be formed for example in a cylindrical or planar manner. The carrier structure itself may also be formed in a cylindrical or planar manner. As an alternative or in addition, it may be provided that the carrier elements respectively have subsurfaces that are spaced apart from one another and that at least two surfaces of the carrier structure, for example the already aforementioned at least two surfaces, are formed by the subsurfaces. Such refinements of the invention may for example have the advantage that the primary conductor arrangements and the secondary conductor arrangements can be arranged on these surfaces, so that for example the conductor portions that generate the primary magnetic field are arranged on one surface area. In order to ensure sufficient flexibility in the generation of the primary magnetic field, in this case the at least two surfaces are preferably respectively formed by at least three subsurfaces. Preferably, more than one subsurface, for example 3, 4, or 7 subsurfaces, are formed along a first, for example axial, direction and more than one subsurface, for example 12 subsurfaces, are formed along a second, for example peripheral, direction. In this case, the surfaces may be formed from the same number or a different number of subsurfaces.

In the case of a further advantageous refinement of the arrangement, it may be provided that the carrier elements define a two-dimensional grid in the carrier structure. As an alternative or in addition, it may be provided that the carrier elements define a two-dimensional grid on at least one surface of the carrier structure, for example on one of the already aforementioned surfaces. In this case, the grid may be formed by subsurfaces of the carrier elements, for example the already aforementioned subsurfaces.

For example in order to achieve effective self-shielding of the structural elements of the arrangement, it may be provided that the carrier structure has an outer surface and an inner surface and that the primary conductor arrangements are arranged on the inner surface and the secondary conductor arrangements are arranged on the outer surface. It may alternatively or cumulatively be provided that the primary conductor arrangements define at least one first area and/or that the secondary conductor arrangements define at least one second area.

Effective self-shielding can be achieved in particular whenever it is provided that the carrier elements respectively have an upper subsurface, on which the respective secondary conductor arrangement is arranged, and a lower subsurface, on which the respective primary conductor arrangement is arranged.

As an alternative or in addition, it may be provided that multiple subsurfaces, for example the upper subsurfaces, form one surface of the carrier structure, for example the already mentioned outer surface, and that the lower subsurfaces form one surface of the carrier structure, for example the already mentioned inner surface. As an alternative or in addition, it may be provided that the lower subsurfaces form a middle surface of the carrier structure. Refinements in which the lower subsurfaces form both the middle surface and the lower surface may be particularly advantageous, since they allow a high density of primary conductor arrangements that are sufficiently large and can be controlled or can be supplied with current independently of one another in pairs, so that the primary magnetic field can be generated spatially precisely.

In the case of a further advantageous refinement of the arrangement, it may be provided that at least two surfaces of the carrier structure are offset relative to one another along a first direction. As an alternative or in addition, it may be provided that the at least two surfaces are offset along a second direction. It may be particularly advantageous if a first offset along the first direction is half the length of one of the carrier elements and/or if a second offset along the second direction is half the width of one of the carrier elements, for example the already just mentioned carrier element. In particular in the case of refinements in which the arrangement is formed in a cylindrical manner, it may be expedient if the first direction is an axial direction and/or if the second direction is a peripheral direction. This is so because an offset along the axial direction may be advantageous since, as a result, the effective spatial resolution with which the main magnetic field can be influenced is able to be increased. An offset along the peripheral direction may have the advantage in particular that an electrical and/or inductive and/or electromagnetic coupling between conductor arrangements or between primary conductor arrangements of different surfaces can be reduced.

A refinement of the arrangement in which it is provided that at least two carrier elements are identically formed can be produced particularly easily and is particularly effective. As an alternative or in addition, it may be provided that at least two conductor arrangements are identically formed or that they at least have a spatial topography that is the same. Preferably, all of the conductor arrangements in which the primary conductor arrangements are arranged on the same surface of the carrier structure are identically formed.

In the case of a further advantageous refinement of the arrangement, it may be provided that the conductor arrangements arranged on the carrier elements respectively comprise two subconductor arrangements that are topologically the same. As an alternative or in addition, the conductor arrangements and/or the carrier elements respectively have a 180° rotational symmetry. This may be advantageous since, as a result, the arrangement or else already the structural elements of the arrangement or at least subconductor arrangements of the structural elements may have particularly advantageous properties. Thus, it can for example be achieved as a result that the individual structural elements are self-shielding and/or that the primary conductor arrangements in a main magnetic field do not undergo any resultant force effect, and consequently are free from forces and torque.

It may have a load-reducing effect if it is alternatively or additionally provided that the conductor arrangements and/or the primary conductor arrangements and/or the secondary conductor arrangements are formed in such a way that, when they are supplied with current in a magnetic field, in particular a constant magnetic field, with a defined direction, in particular in the position for use in the main magnetic field, they are respectively free from forces and/or torque. This may be achieved for example by using symmetries or knowledge of physical conservation laws or by using a computer program for calculating conductor layouts.

In order to achieve sufficient spacing between primary conductor arrangements and secondary conductor arrangements, it may be provided that at least one of the conductor arrangements, preferably each conductor arrangement, has connecting conductors or connecting conductor portions, which connect the respective primary conductor arrangement to the respective secondary conductor arrangement. As an alternative or in addition, it may be provided that the connecting conductors or the connecting conductor portions respectively run on an axially oriented subsurface of the respective carrier element. The connecting conductors or the connecting conductor portions in this case preferably run in a middle region of the carrier element. This may be advantageous since in this way arrangements can be constructed with multiple surfaces of primary conductor arrangements without any soldering of wires being required. Furthermore, in this way any penetration of conductors of different conductor arrangements is avoidable. Furthermore, it may be provided that the connecting conductors or the connecting conductor portions between the primary conductor arrangement and the secondary conductor arrangement are enclosed by a receptacle of a neighboring carrier element.

In order to achieve fixing of the conductor arrangement on the carrier elements, it may be provided that the carrier elements respectively have at least one groove, into which at least one portion of at least one conductor of the respective conductor arrangement, for example of the already aforementioned at least one conductor, can be placed or has been placed.

In order to connect the conductor arrangements to the respective current source, in the case of a further advantageous refinement of the arrangement it may alternatively or additionally be provided that the carrier elements have terminals or terminal points for terminal conductors. The terminals may be for example current terminals, in particular sockets. The terminal points may be formed for example as openings in the respective carrier element or be formed by ends of a or the groove in the respective carrier element or by peripheries of the respective carrier element. If the conductor arrangement has at least one conductor, the at least one conductor may also be able to be connected to terminal conductors in one piece. The terminal conductors are conductors or conductor portions that connect the respective conductor arrangements to a current source and usually only generate little magnetic field, preferably no magnetic field at all, in the z direction. Consequently, the terminal conductors respectively serve for supplying the conductor arrangements arranged on the respective carrier elements. The terminal conductors are therefore expediently to be considered independently of the conductor arrangements and formally do not form a component part of the conductor arrangements, even if they may be connected to them in one piece, for example in the form of a coil formed from a wire. It may be expedient if each carrier element has precisely two terminals or terminal points, the at least one conductor preferably connecting the terminals or the terminal points to one another. It may alternatively or additionally be provided that the conductor arrangements respectively have one or precisely one current input and one or precisely one current output.

In the case of a further refinement of the arrangement, it may be provided that the carrier elements respectively form hollow chambers, in particular for the arrangement of terminal conductors.

In order to ensure sufficient cooling, it may be provided that the carrier elements respectively form portions of cooling channels.

To achieve the stated object, one or more features directed to a method for producing an arrangement of the type described at the beginning are provided according to the invention. In particular, to achieve the stated object, it is consequently provided according to the invention in the case of a method of the type described at the beginning that a conductor arrangement, for example the already aforementioned respective conductor arrangement, is respectively applied to at least three carrier elements, for example to the already aforementioned at least three carrier elements, and that then the carrier elements are assembled to form the carrier structure. It may be particularly advantageous if this takes place in that the carrier elements are connected, in particular mechanically connected, to neighboring carrier elements. This may for example take place by the carrier elements being pushed into one another and/or inserted into one another and/or made to engage with one another and/or placed against one another and connected to one another by way of fastening means. It may also be provided that at least one carrier element or each carrier element is respectively mechanically connected to at least one or to all of the neighboring carrier elements. Such methods may be advantageous, since they allow a modular construction of a flexible gradient and/or shimming system of great effectiveness.

In the case of an advantageous refinement of the method, it may be provided that an arrangement that is formed according to the invention, in particular as described above and/or according to one of the claims directed to an arrangement, is used. The features of such refinements of an arrangement according to the invention are conducive to an inexpensive modular type of construction of a flexible and effective gradient and/or shimming system and can consequently have positive effects on a method according to the invention.

In order to increase the stability of the arrangement and/or in order to electrically insulate the arrangement or protect it from environmental influences and/or give the carrier structure a desired form, it may be provided that, after the carrier elements have been assembled to form the carrier structure, the arrangement is cast with a casting compound, preferably with epoxy resin.

In order to simplify the production process further, it may be provided in a further advantageous refinement of the method that the conductor arrangements are respectively created and/or applied to the respective carrier element by a technical process, for example by etching, milling, 3D printing or casting. As an alternative or in addition, it may be provided that the conductor arrangements respectively are formed of precisely one conductor, for example the already aforementioned conductor, the conductor being applied to the respective carrier element in that it is wound or wound up onto the carrier element.

For operating an arrangement that has already been produced, the conductor arrangements are expediently respectively connected by way of terminal conductors to a current source, in particular to an amplifier or to an output of a controllable interconnecting device that is connected to multiple amplifiers.

The invention may also relate to a gradient system which has an arrangement that is formed according to the invention, in particular as described above and/or according to one of the claims directed to an arrangement. The invention may also relate to a shimming system or a combined gradient and shimming system with such an arrangement according to the invention.

BRIEF DESCRIPTION OF THE DRAWINGS

The invention will now be described in more detail on the basis of a small number of exemplary embodiments, but is not restricted to these few exemplary embodiments. Further exemplary embodiments are provided by combining the features of one or more of the claims with one another and/or with one or more features of the exemplary embodiments.

In the figures.

DETAILED DESCRIPTION OF THE PREFERRED EMBODIMENTS

In the following description of various exemplary embodiments of the invention, elements which correspond in terms of their function are provided with corresponding designations even when their configuration or shape differs.

Figure 1:
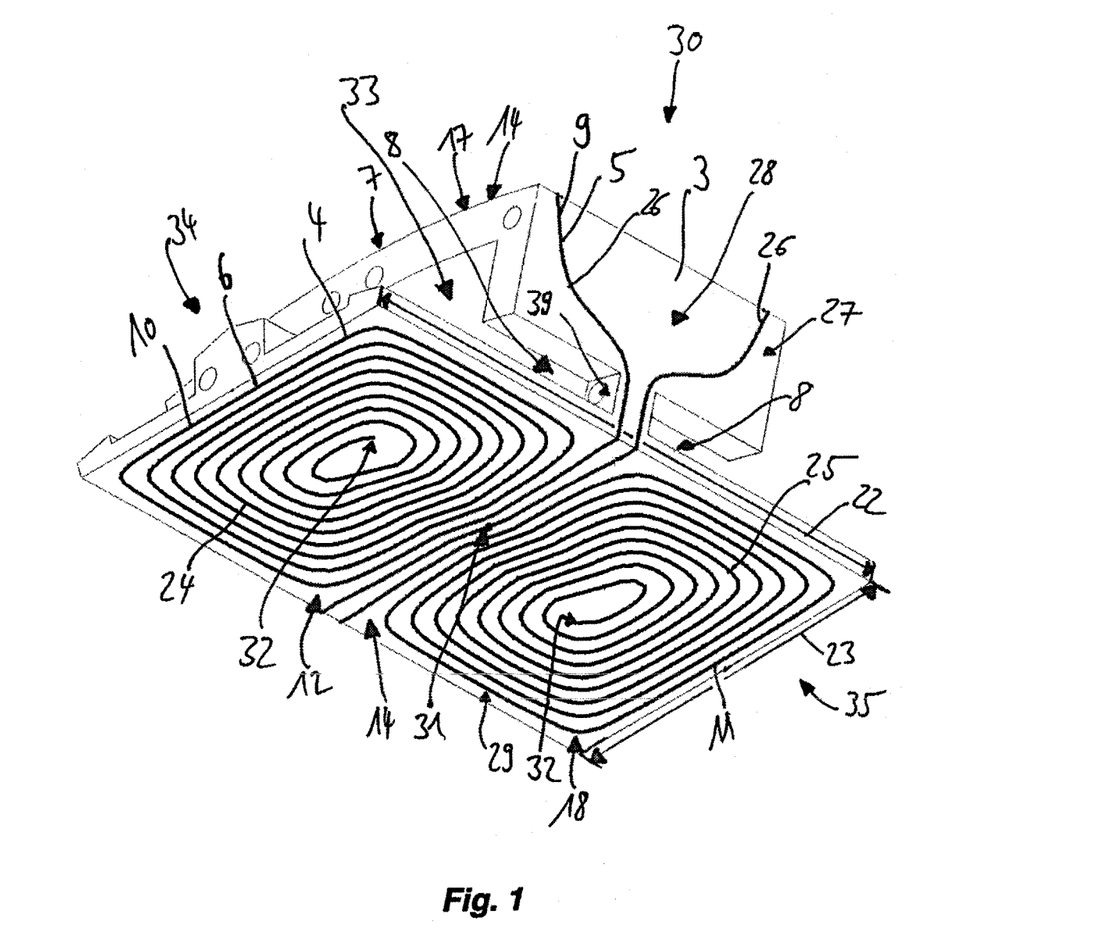
FIG. 1 shows a structural element of the arrangement, viewed from below.
Figure 2:
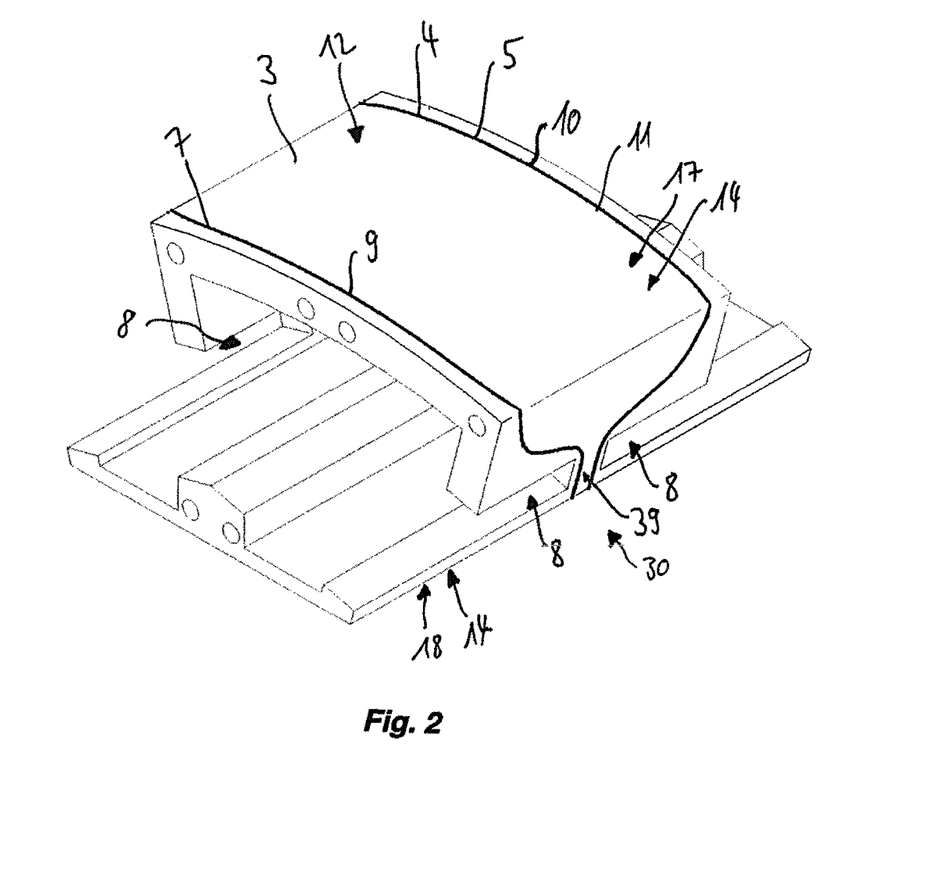
FIG. 2 shows the structural element shown in FIG. 1, viewed from above.

FIG. 1 and FIG. 2 show a structural element 30 from two different perspectives. In FIG. 1, the primary conductor arrangement 6 that generates a primary magnetic field can be seen. In FIG. 2, on the other hand, the secondary conductor arrangement 7, which serves for shielding the primary magnetic field in the upward direction by significantly reducing the primary magnetic field in the upward direction, can be seen.

The structural element 30 has a carrier element 3. The carrier element 3 is produced from plastic by a 3D printer, and consequently is formed of an insulating material. In an alternative exemplary embodiment, the carrier element 3 may for example also be produced from an artificial stone. Arranged on the carrier element 3 is a conductor arrangement 4 formed as a wire 9. The conductor arrangement 4 consequently comprises precisely one conductor 5, which is wound around the carrier element 3. The wire 9 consequently forms a coil 10 and a winding 11. The wire 9 is in this case wound up onto the carrier element 3 in such a way that it runs on an outer surface 12 of the carrier element 3. Formed for this purpose in the carrier element 3 is a groove 29, which is not explicitly depicted and into which the wire 9 has been placed.

The carrier element 3 has two spaced-apart subsurfaces 14, one subsurface 14 being formed by the upper subsurface 17 and the other subsurface 14 being formed by the lower subsurface 18. On the lower subsurface 18 of the carrier element 3, a portion of the wire 9 is arranged in a substantially volute manner and forms the primary conductor arrangement 6 of the conductor arrangement 4. If the wire 9 is flowed through by current, the primary conductor arrangement 6 generates a primary magnetic field, which in the position for use superposes itself with the primary magnetic fields generated by the primary conductor arrangements 6 of other carrier elements 3 and, after installation in an MR tomograph, is capable of modifying the main magnetic field. On account of the superposition principle, the superposing of the individual primary magnetic fields likewise forms a primary magnetic field.

The wire 9 is wound onto the carrier element 3 in such a way that the conductor arrangement 4 formed by it, and also the carrier element 3 itself, has a rotational symmetry. This is a 180° rotational symmetry at an axis which extends up vertically from the lower subsurface 18 and passes the point of rotation 31. This rotational symmetry has the effect that the conductor arrangement 4 does not include merely two subconductor arrangements 24, 25 that are topologically the same, but rather two identical subconductor arrangements 24, 25. Each of the two subconductor arrangements 24, 25 is formed of a wire portion arranged in a volute manner on the lower subsurface 18, two connecting conductors 26 arranged on opposite subsurfaces 27, a longitudinally arranged wire portion, depicted in FIG. 2, on the upper subsurface 17 and a conductor portion, which runs from the periphery of the carrier element 3 to the point of rotation 31. The connecting conductors 26 in this case connect the primary conductor arrangement 6 to the secondary conductor arrangement 7 and respectively run on a subsurface 27 of the carrier element 3 that in the position for use is axially oriented, in a middle region 28 of the same. The 180° rotational symmetry with the double volute conductor layout on the lower subsurface 18 also has the effect that, in a main magnetic field that is oriented along a longitudinal edge of the carrier element 3, the primary conductor arrangement 6 is not exposed to any resultant torque or any translationally acting resultant force.

The wire 9 can be connected in one piece to terminal conductors, and consequently can be connected to a current source. For this purpose, the carrier element 3 respectively has in the middle of the two volute wire formations an opening 32 (not shown), through which the respective terminal conductor can be passed and, on one side 34, 35 of the carrier element 3, can be led out of the cavity 33 formed within the carrier element 3 to a current source.

Figure 3:
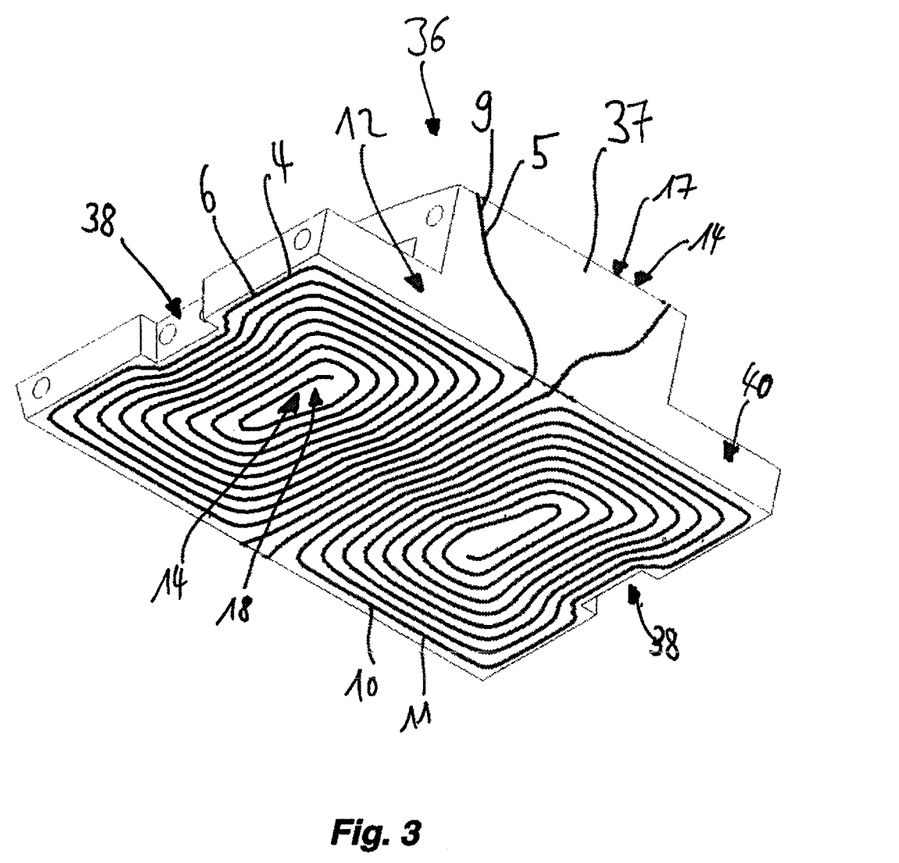
FIG. 3 shows another structural element of the arrangement, viewed from below.
Figure 4:
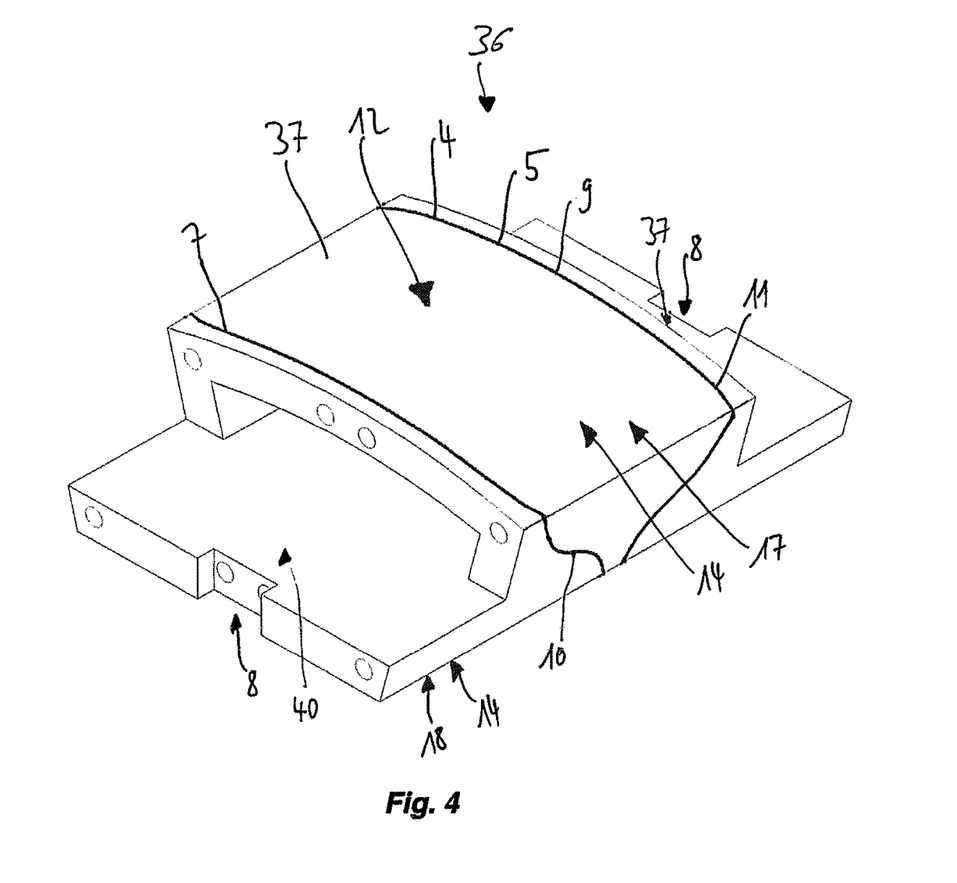
FIG. 4 shows the structural element shown in FIG. 3, viewed from above.

FIG. 3 and FIG. 4 show a structural element 36, which is a designed differently from the structural element 30 in FIG. 1 and FIG. 2. The carrier element 37 depicted in FIGS. 3 and 4 is somewhat flatter than the carrier element 3 shown in FIGS. 1 and 2. The structural element 36 has two receptacles 38, which are dimensioned in such a way that webs 39, serving as receptacle counterparts, of two carrier elements 3 placed against one another of the type represented in FIGS. 1 and 2 can be received in them. Correspondingly, the lower plate 40, serving as a receptacle counterpart, of the carrier element 37 has a thickness which is adapted to the width of the receptacles 8 of the carrier element 3 from FIGS. 1 and 2. The carrier element 3 is consequently insertable into the carrier element 37, and vice versa, so that a carrier structure 2 can be assembled from these two types of carrier elements 3, 37. See FIGS. 5-7.

Figure 5:
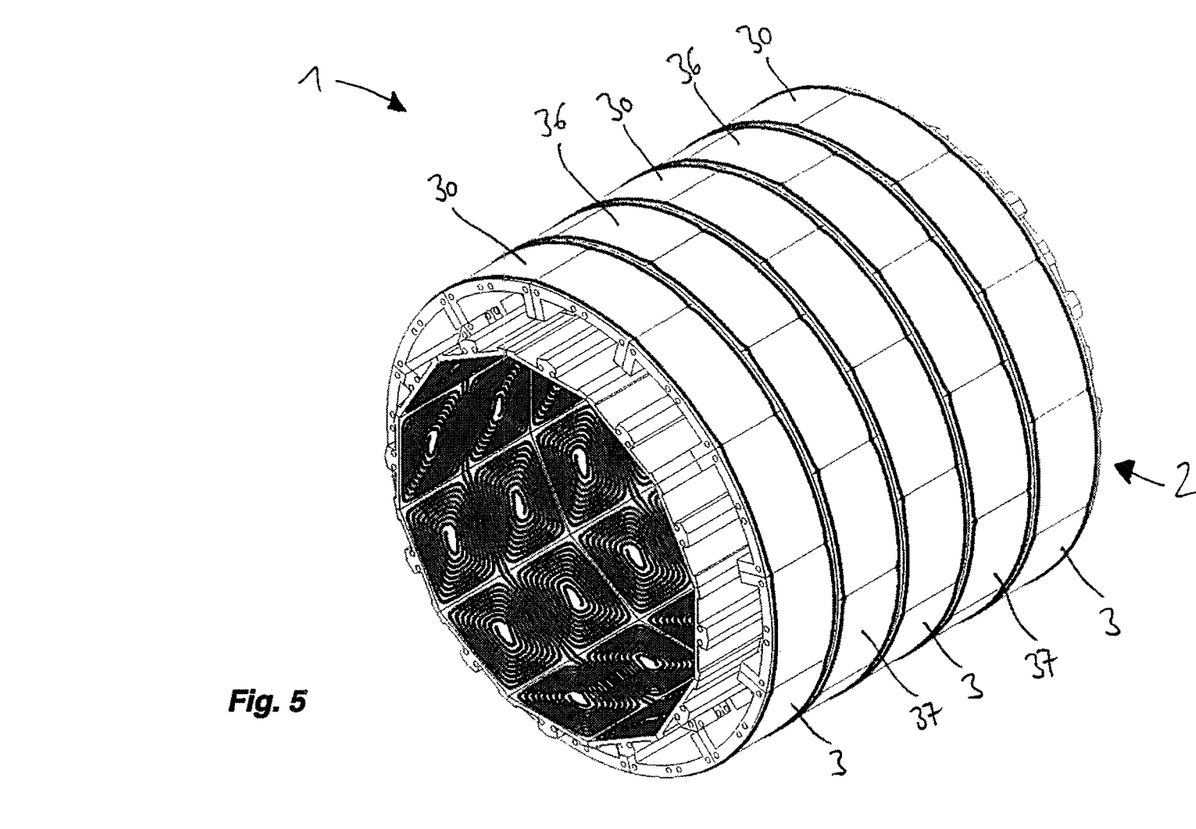
FIG. 5 shows an arrangement according to the invention.

FIG. 5 shows an arrangement 1 according to the invention, which is assembled from the two types of structural elements 30, 36 as represented in FIG. 1-FIG. 4. The arrangement 1 is formed altogether of 5 times 12 structural elements 30, 36, specifically of 3 times 12 structural elements 30 of the type shown in FIGS. 1 and 2 and of 2 times 12 structural elements of the type shown in FIGS. 3 and 4. In an alternative exemplary embodiment, the arrangement 1 has altogether 7×12 structural elements 30, 36. More specific details of the arrangement 1 can be seen from FIG. 6 and FIG. 7, which show multiple assembled structural elements 30, 36 from two different perspectives.

Figure 6:
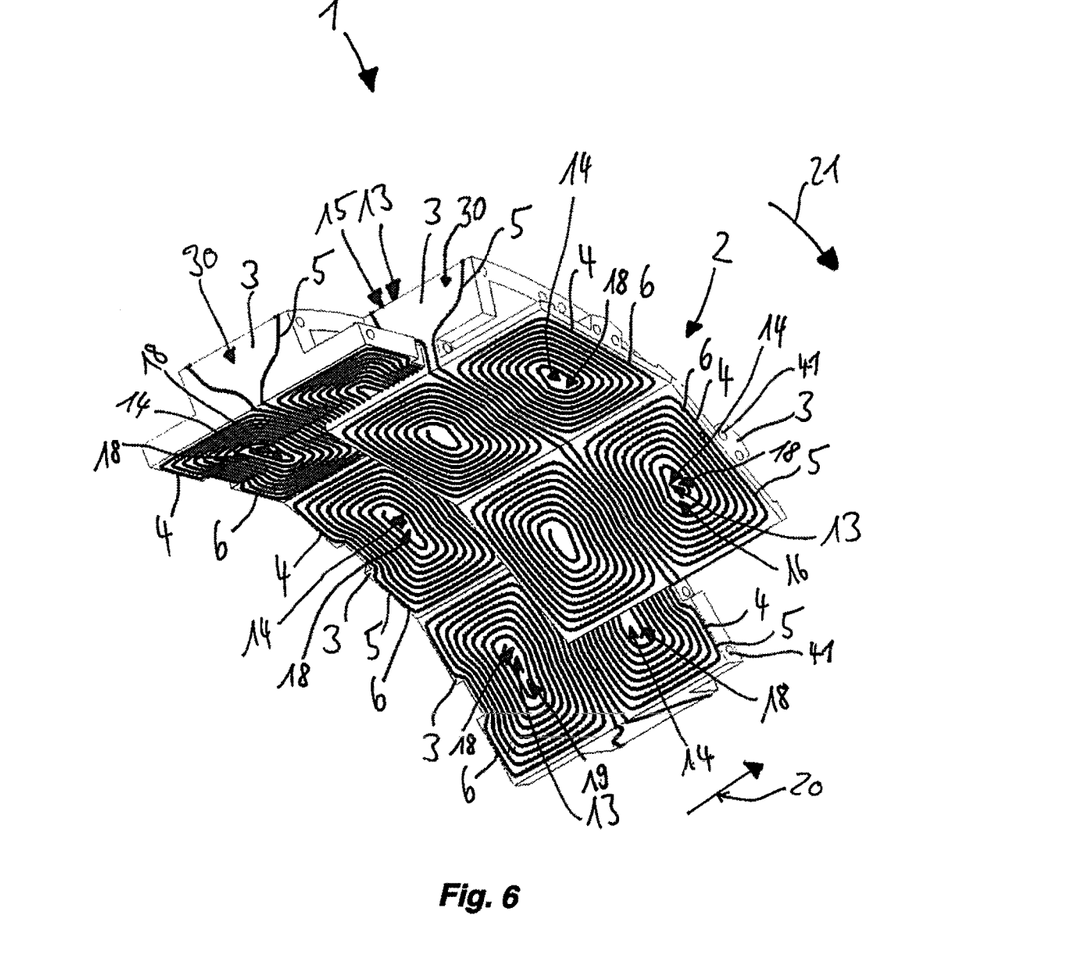
FIG. 6 shows multiple assembled structural elements, viewed from inside.
Figure 7:
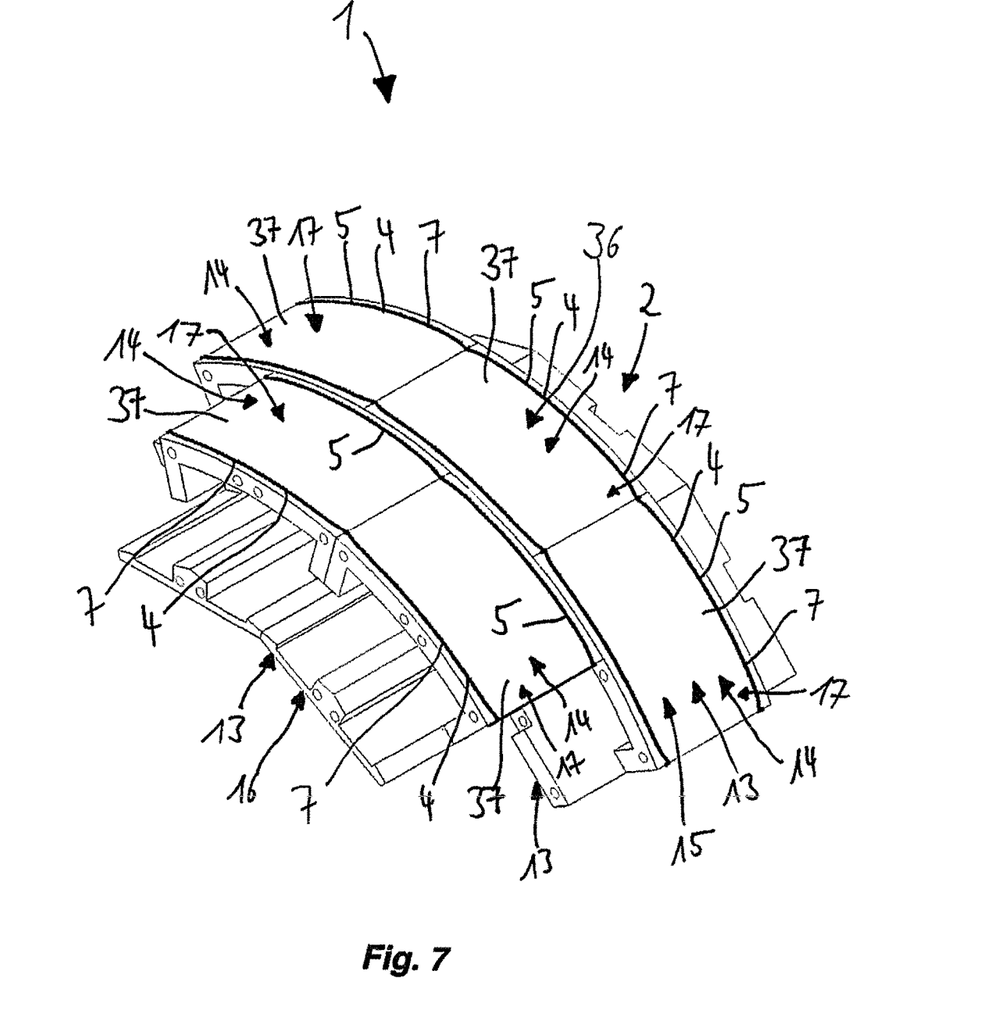
FIG. 7 shows the structural elements shown in FIG. 6, viewed from outside.

As can be seen from FIGS. 5-7, the cylindrical carrier structure 2 is assembled from carrier elements 3, 37 that are mechanically connected to one another. The arrangement 1 is in this case assembled from two groups of identically formed structural elements 30, 36. Within each of these two groups of structural elements 30, 36, the carrier elements 3, 37 and the conductor arrangements 4 arranged on them are consequently identically formed. In addition, each group has a volute double structure, so that the primary conductor arrangements 5 of the two types of structural elements 30, 36 have the same spatial topology.

The carrier structure 2 forms three spaced-apart cylindrical surfaces 13, on which portions of conductors 5 are arranged. The carrier structure 2 has an outer surface 15, on which the secondary conductor arrangements 7 of the individual structural elements 30, 36 are arranged. In this case, the carrier elements 3 are dimensioned in such a way that their respective rectangular upper subsurfaces 17 form the outer surface 15 when placed against one another. The carrier structure 2 also has an inner surface 16, on which the primary conductor arrangements 5 of the type of structural elements 30 shown in FIGS. 1 and 2 are arranged. The inner surface 16 is in this case formed by the lower subsurfaces 18 of this type of structural elements 30. The carrier structure 2 also has a middle surface 19, on which the primary conductor arrangements 5 of the type of structural elements 36 shown in FIGS. 3 and 4 are arranged and which are formed by the lower subsurfaces 18 of this type of structural elements 36.

The middle surface 19 and the inner surface 16 of the carrier structure 2 are arranged offset in relation to one another along the axial first direction 20 by half a length 22 of a carrier element 3, 37 and along the peripheral second direction 21 by half a width 23 of a carrier element 3, 37. This arrangement is optimal, since it leads to a low coupling between the primary conductor arrangements 5 and since it leads to an increased spatial formability of a primary magnetic field to be generated.

The arrangement 1 may be produced from the individual structural elements 30, 36 in that first a wire 9 is respectively wound around the carrier elements 3, 37. Then, the carrier structure 2 is assembled in that the carrier elements 3, 37 are pushed onto one another. For this purpose, the webs 39 in particular are pushed into a receptacle 38 of a neighboring carrier element 37. This pushing of carrier elements 3 into receptacles 38 of neighboring carrier elements 37 already has the effect that neighboring carrier elements 3, 37 are mechanically connected to one another. Further mechanical stabilization can take place by for example fitted pins or tubes, in particular metallic and/or nonmagnetic tubes, or else hoses being pushed into drilled holes 41, which for the sake of overall clarity are only provided with designations at two points in FIG. 6, the tubes or the hoses being able in particular to serve at the same time for supplying cooling water. Further stabilization may also take place by a releasable interlocking clamping of neighboring carrier elements 3, 37 taking place, for example by means of snap-in elements, or by a further treatment step being used to establish a material-bonding connection between the carrier elements 3, 37, which under some circumstances may also take place irreversibly, so that the carrier structure 2 would no longer be able to be dismantled.

In the case of the exemplary embodiment shown in FIGS. 5-7, the arrangement 1 can however be dismantled by pulling the carrier elements 3, 37 apart. This is possible in particular for the reason that the conductor arrangements 4 are separable from one another without nodes. Also, the prefabrication of the individual structural elements 30, 36 means that the conductor arrangements 4 can be arranged without solder points, and that they are also arranged without solder points after production of the arrangement 1. It is noticeable in this case that the conductor arrangements 4 in pairs have a linking number of zero. This is so because the wires 9 forming the respective coils 10 are not wound around one another, but respectively form a topologically closed unit that is not penetrated by conductors 5.

For the operation of the arrangement 1 depicted in FIG. 5 in a gradient and/or shimming system, the arrangement 1 may be fitted into an MR tomograph in such a way that the axial first direction 20 is oriented along the main magnetic field generated by the MR tomograph. If the arrangement 1 is then supplied with current, in that for example each coil 10 is connected to a gradient amplifier, the primary conductor arrangements 5 can be supplied with current independently of one another. By varying the currents in the coils 10, it is possible to generate a spatially/temporally varying primary magnetic field, in particular along the axial first direction 20, which can modify the main magnetic field in such a way that as a result spatial encoding is made possible and/or that there is a homogenization of the main magnetic field, which is required for a shimming process. The arrangement 1 depicted in FIG. 5 is consequently particularly well suited for the modification of a main magnetic field generated in an MR tomograph.

It is here provided to assemble a carrier structure 2 of an arrangement 1 for modifying a main magnetic field generated in an MR tomograph from multiple carrier elements 3, 37. A conductor arrangement 4 is respectively arranged on each carrier element 3, 37. The conductor arrangements 4 respectively comprise a primary conductor arrangement 6 for generating a primary magnetic field that modifies the main magnetic field and a secondary conductor arrangement 7 for shielding the primary magnetic field. The invention also relates to a method for producing a modularly constructible arrangement 1, which can be used for example for spatial encoding.

LIST OF DESIGNATIONS 1 arrangement
2 carrier structure
3 carrier element
4 conductor arrangement
5 conductor
6 primary conductor arrangement
7 secondary conductor arrangement
8 receptacle
9 wire
10 coil
11 winding
12 surface of 3
13 surface of 2
14 subsurface of 3
15 outer surface of 2
16 inner surface of 2
17 upper subsurface of 3
18 lower subsurface of 3
19 middle surface of 2
20 first direction
21 second direction
22 length of 3
23 width of 3
24 subconductor arrangement
25 further subconductor arrangement
26 connecting conductor
27 subsurface of 3
28 middle region of 3
29 groove
30 structural element
31 point of rotation
32 opening
33 cavity
34 side of 3
35 further side of 3
36 further structural element
37 further carrier element
38 receptacle of 37
39 web
40 lower plate of 3
41 drilled hole

The invention claimed is:

1. An arrangement (1) for modifying a main magnetic field generated in a magnetic resonance tomograph, comprising a carrier structure (2) having at least first, second, and third carrier elements (3, 37), at least first, second, and third conductor arrangements (4) respectively arranged on corresponding ones of the carrier elements (3, 37), the conductor arrangements (4) respectively comprise a primary conductor arrangement (6) for generating a primary magnetic field that modifies the main magnetic field and a secondary conductor arrangement (7) for shielding the primary magnetic field, the carrier elements (3, 37) are mechanically connected to neighboring ones of the carrier elements (3, 37), and each of the carrier elements (3, 37) has at least one receptacle (8, 38) for receiving a receptacle counterpart of a neighboring one of the carrier elements (3, 37).

2. The arrangement as claimed in claim 1, wherein the primary conductor arrangements (6) are supplied with current independently of one another or are supplied with current independently of one another in pairs, or the conductor arrangements (4) are respectively connected separately from one another to at least one of a current source or to a current supply, or both.

3. The arrangement (1) as claimed in claim 1, wherein the carrier elements (3, 37) are connected or are connectable at least one of releasably, in an interlocking, frictionally engaging, or material-bonding manner.

4. The arrangement (1) as claimed in claim 1, wherein the conductor arrangements (4) respectively comprise at least one conductor (5) or are formed of precisely one conductor (5).

5. The arrangement (1) as claimed in claim 1, wherein the conductor arrangements (4) are respectively formed by at least one coil (10) or winding (11), or the conductor arrangements (4) are respectively formed without branching, or both.

6. The arrangement (1) as claimed in claim 1, wherein the conductor arrangements (4) are in pairs and have a linking number of zero, the conductor arrangements (4) are separable from one another without nodes such that the arrangement (1) are dismantleable by pulling the carrier elements (3, 37) apart, or the conductor arrangements are arranged without solder points, or any combination of thereof.

7. The arrangement (1) as claimed in claim 1, wherein the conductor arrangements (4) are respectively arranged on an outer surface (12) of the respective carrier element (3, 37).

8. The arrangement (1) as claimed in claim 1, wherein the carrier structure (2) forms at least two surfaces (13) that are spaced apart from one another, or the carrier elements (3, 37) respectively have subsurfaces (14) that are spaced apart from one another and the at least two surfaces (13) of the carrier structure (2) are formed by the subsurfaces (14).

9. The arrangement (1) as claimed in claim 8, wherein the at least two surfaces (13) are cylindrical or planar surfaces.

10. The arrangement (1) as claimed in claim 9, wherein the carrier elements (3, 37) define a two-dimensional grid in the carrier structure (2) or on a surface (13) of the carrier structure (2).

11. The arrangement (1) as claimed in claim 9, wherein the carrier structure (2) has an outer surface (15) and an inner surface (16) and the primary conductor arrangements (6) are arranged on the inner surface (16) and the secondary conductor arrangements (7) are arranged on the outer surface (15).

12. The arrangement (1) as claimed in claim 11, wherein the carrier elements (3, 37) respectively have an upper subsurface (17), on which the respective secondary conductor arrangement (7) is arranged, and a lower subsurface (18), on which the respective primary conductor arrangement (6) is arranged, or multiple of the upper subsurfaces (17) form the outer surface (15) of the carrier structure (2) and the lower subsurfaces (18) form the inner surface (16) of the carrier structure (2) or a middle surface (19) of the carrier structure (2) or both.

13. The arrangement (1) as claimed in claim 1, wherein the carrier structure (2) is formed with at least two surfaces that are spaced apart from one another, the at least two surfaces (15, 16, 19) are formed by subsurfaces of the carrier elements that are offset relative to one another along a first direction (20) and a second direction (21), and a first offset along the first direction (20) is half a length (22) of one of the carrier elements (3, 37) and a second offset along the second direction (21) is half a width (23) of one of the carrier elements (3, 37).

14. The arrangement (1) as claimed in claim 1, wherein at least two of the carrier elements (3, 37) are identically formed, or at least two conductor arrangements (4) are identically formed or have at least a spatial topology that is the same, or at least two of the carrier elements (3, 37) are identically formed and at least two conductor arrangements (4) are identically formed or have at least a spatial topology that is the same.

15. The arrangement (1) as claimed in claim 1, wherein the conductor arrangements (4) arranged on the carrier elements (3, 37) respectively comprise two subconductor arrangements (24, 25) that are topologically the same, wherein at least one of the conductor arrangements (4) or the carrier elements (3, 37) respectively have a 180° rotational symmetry about an axis that extends through a rotation point (31) on a surface of the carrier elements on which the primary conductors are arranged.

16. The arrangement as claimed in claim 1, wherein at least one of the conductor arrangements (4) has connecting conductors (26), which connect the respective primary conductor arrangement (6) to the respective secondary conductor arrangement (7) or which respectively run on an axially oriented subsurface (27) of the respective carrier element (3, 37), or both.

17. The arrangement as claimed in claim 1, wherein the carrier elements (3, 37) have terminals or terminal points for terminal conductors.

18. A method for producing an arrangement (1) as claimed in claim 1, comprising applying the at least first, second, and third conductor arrangements (4) respectively to the at least first, second, and third carrier elements (3, 37), and then assembling the carrier elements (3, 37) to form the carrier structure (2).

19. The arrangement (1) as claimed in claim 1, wherein the conductor arrangements (4), the primary conductor arrangements, the secondary conductor arrangements, or a combination thereof are formed such that, when they are supplied with current in a magnetic field with a defined direction they are respectively free from at least one of forces or torque.

20. The arrangement (1) as claimed in claim 1, wherein the carrier elements (3) are formed of an insulating material.

* * * * *